United States Patent [19]

Oudick et al.

[11] Patent Number: 5,050,036
[45] Date of Patent: Sep. 17, 1991

[54] LIQUID COOLED INTEGRATED CIRCUIT ASSEMBLY

[75] Inventors: Tom A. Oudick, Eastsound, Wash.; Gregory Shmunis, San Francisco, Calif.

[73] Assignee: Amdahl Corporation, Sunnyvale, Calif.

[21] Appl. No.: 426,093

[22] Filed: Oct. 24, 1989

[51] Int. Cl.⁵ .............................................. H05K 7/20
[52] U.S. Cl. .................... 361/385; 165/80.5; 357/82
[58] Field of Search .................. 361/382, 385–388, 361/395, 396, 400, 414; 165/80.4, 104.33, 185; 174/15.1, 16.3; 357/82

[56] References Cited

U.S. PATENT DOCUMENTS

| 3,649,738 | 3/1972 | Anderson et al. | 174/15.1 |
| 4,072,188 | 2/1978 | Wilson | 165/80.4 |
| 4,644,385 | 2/1987 | Nakanish | 357/82 |
| 4,652,970 | 3/1987 | Watari | 361/385 |
| 4,686,606 | 8/1987 | Yamada et al. | 361/385 |
| 4,694,378 | 9/1987 | Nakayama et al. | 361/385 |
| 4,729,060 | 3/1988 | Yamamoto et al. | 361/385 |
| 4,781,244 | 11/1988 | Kuramitsu | 165/80.4 |

FOREIGN PATENT DOCUMENTS

2813529 10/1979 Fed. Rep. of Germany .

OTHER PUBLICATIONS

Fujitsu, Science Tech. Journal, 23, 4 pp. 243–254, 12/87, Yamamoto et al.

Primary Examiner—Gerald P. Tolin
Attorney, Agent, or Firm—Fliesler, Dubb Meyer & Lovejoy

[57] ABSTRACT

A liquid cooled integrated circuit assembly including a plurality of integrated circuit packages for housing and electrically interconnecting integrated circuits, a printed circuit board for mounting the integrated circuit packages, and flexing tubing for supplying coolant to the integrated circuit packages. Each integrated circuit package has a first cavity housing the semiconductor die and a second cavity for receiving the liquid coolant. The integrated circuit is mounted on a portion of the package which forms a wall separating the first and second cavities. Heat is transformed from the integrated circuit to the coolant by the wall separating the cavities. Thus, a minimum number of thermal interference are involved in transferring the heat generated by the integrated circuit and the thermal resistance of the heat transferring structure is approximately one-third of the thermal resistance of conventional packages.

6 Claims, 2 Drawing Sheets

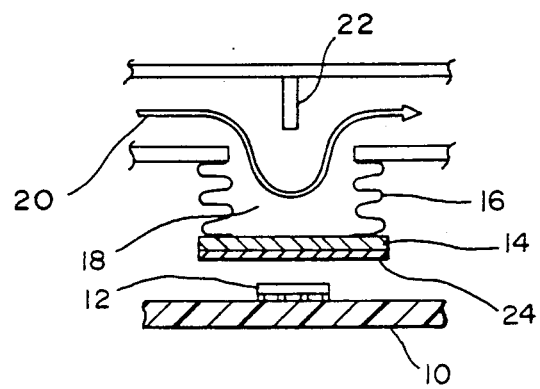
(PRIOR ART)
FIG.—1
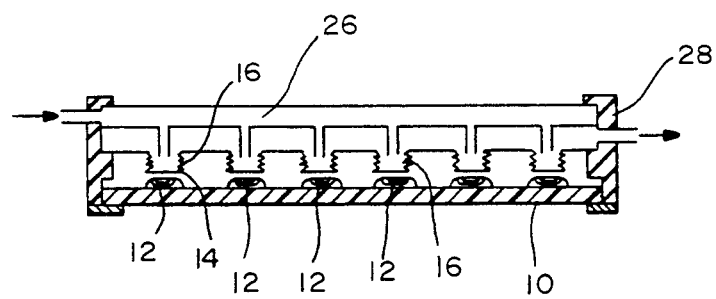
(PRIOR ART)
FIG.—2
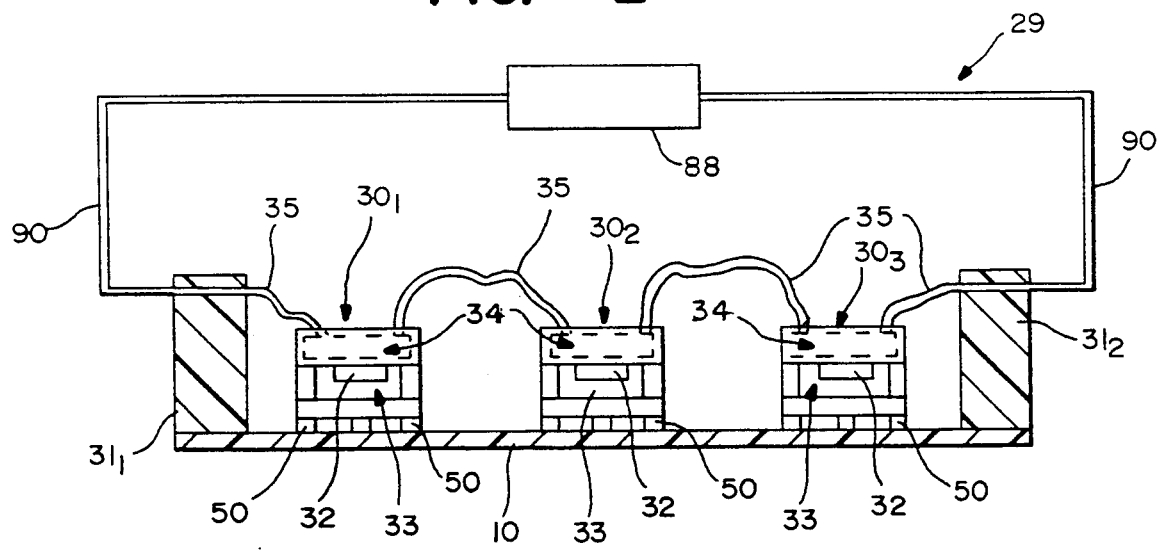
FIG.—3

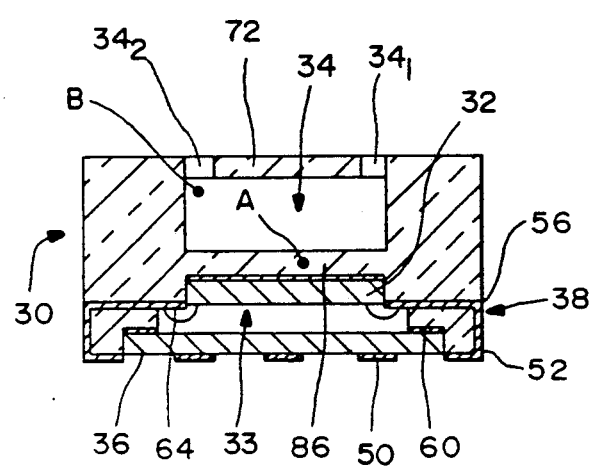
FIG.—4
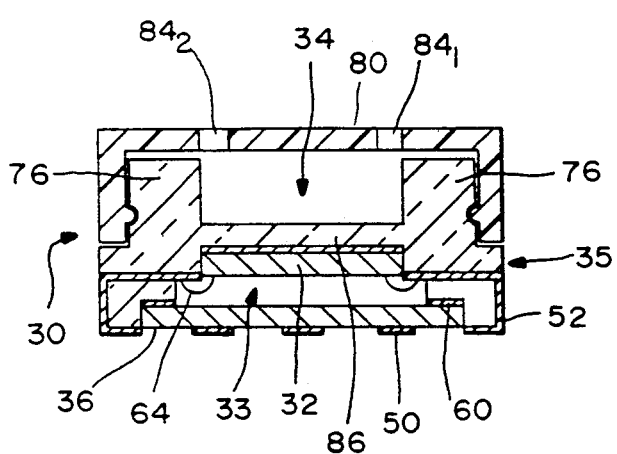
FIG.—6
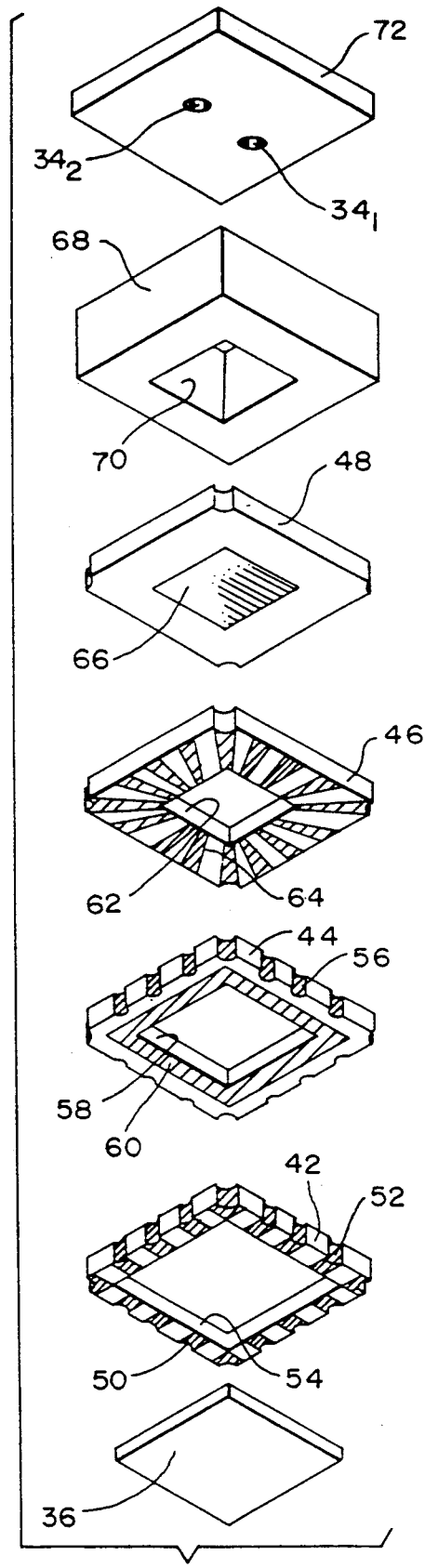
FIG.—5

LIQUID COOLED INTEGRATED CIRCUIT ASSEMBLY

BACKGROUND OF THE INVENTION

1. Field of the Invention

The present invention relates to a cooling system for electrical devices; more particularly, to a liquid cooled integrated circuit assembly and a cooling system for a plurality of integrated circuit assemblies.

2. Description of the Related Art

High-density multi-layer printed wiring boards suitable for surface mounting of electrical devices have been developed to provide increasingly smaller spacings between devices and increasingly larger pin densities and pin counts per device. The continuing trend towards greater integration of electrical devices on one interconnection mechanism, for example, a printed circuit board, and the continuing need for increased pulse propagation velocity has caused many features of conventional multi-layer printed wiring boards to approach physical limits. One limiting factor is the transferring away of the heat generated by electrical devices, e.g., integrated circuit packages mounted on the printed circuit board.

As used herein, the following terms have the following meanings: "integrated circuit" means a die; "integrated circuit package" means a structure including an integrated circuit, a package for encapsulating the integrated circuit and having a heat sink; "heat sink" means any portion of a package designed to transfer heat away from an integrated circuit to a coolant, e.g., air or liquid; and "integrated circuit assembly" means a plurality of integrated circuit packages mounted on a supporting structure and a coolant supply system for providing coolant to the integrated circuit packages.

In a conventional integrated circuit assembly, as shown in FIG. 1, a heat transfer element 14 is placed in contact with an integrated circuit package 12 by pressure from a spring or a bellows 16. Heat generated by the operation of the integrated circuit (not shown) enclosed in integrated circuit package 12 is transferred from the integrated circuit to the heat sink portion, from the heat sink to the heat transfer element 14, and from the heat transfer element 14 to a coolant (usually a liquid or gaseous coolant). Conventional cooling systems have problems which include: poor surface contact between the integrated circuit package 12 and the heat transfer element 14, resulting in a large and non-uniform thermal contact resistance; and changes in the thermal contact resistance between integrated circuit package 12 and heat transfer element 14, and thus unstable heat dissipation, due to changes in the pressure applied by the spring or bellows 16. These problems result in relatively poor heat transfer efficiency.

A cooling system for integrated circuit packages which is intended to overcome some of these problems is disclosed in U.S. Pat. No. 4,729,060, Yamamoto, et al. FIG. 1 herein is a reproduction of FIG. 1 of Yamamoto et al. with the exception of the reference numbers; citations of reference numerals relate to FIG. 1 herein. Yamamoto, et al. provide a compliant member 24 between integrated circuit package 12 and heat transfer element 14. Compliant member 24 is stated to improve the thermal contact between integrated circuit package 12 and heat transfer element 14; however, compliant member 24 increases the number of thermal interfaces, by adding thermal interfaces between integrated circuit element 12 and compliant member 24 and between compliant member 24 and heat transfer element 14.

Each thermal interface reduces the ability of the integrated circuit assembly to transfer heat generated by the integrated circuits. Conventional cooling systems have been modified over time to maintain an acceptable temperature of an integrated circuit generating up to approximately 30 watts. This upper limit on the integrated circuit power generation is due, at least in part, to the large thermal resistance of the structure provided between the integrated circuit and the coolant in the bellows. The thermal resistance of conventional devices is on the order of 0.6° to 1° C./watt. The thermal resistance of a structure is a ratio of the temperature differential between the surfaces of a structure which transfers heat from one surface to the other to the power transferred. Further discussion regarding thermal resistance may be found in Fujitsu Soientific Technical Journal, 23.4, page 243-254, Deoember 1987.

Several other problems are associated with the conventional integrated circuit assembly shown in FIG. 1. First, in order to improve thermal contact the surfaces of elements 12 and 14 must be extremely flat, which requires expensive manufacturing techniques. Second, bellows 16, which is usually plated with gold, is expensive both from a materials and a labor standpoint. Third, accessibility is hampered because compliant member 24 tends to adhere to the surfaces of elements 12 and 14, making it difficult to disassemble the integrated circuit assembly for testing and reworking during manufacturing.

A further problem with a conventional liquid cooled integrated circuit assembly is related to the pressure applied to printed circuit board 10 by bellows 16. Mechanical pressure is created by bellows 16 which forces the heat transfer element 14 attached to the bellows 16 into contact with integrated circuit 12. In addition, hydraulic pressure is operated by pumping coolant into cavity 18 in bellows 16. The combined pressure of a large number of bellows 16 contacting a large number of integrated circuits 12 mounted on a single printed circuit board 10 creates stresses in the printed circuit board 10. This stress leads to damage to the printed circuit board 10 and the electrical circuits therein, reducing the reliability of the printed circuit board 10 and the integrated circuits 12 mounted thereon.

In order to create mechanical pressure against the integrated circuits, conventional integrated circuit assemblies utilize a rigid header 26 mounted to the printed circuit board 10 by supports 28. The combined mechanical and hydraulic pressure created by all of the bellows 16 creates a large amount of stress on the printed circuit board 10.

SUMMARY OF THE INVENTION

It is, therefore, an object of the present invention to provide an integrated circuit package having an integral coolant cavity.

A further object of the present invention is to provide a liquid cooled integrated circuit assembly which has a lowered thermal resistance due to a reduced number of interfaces.

Another object of the present invention is to provide a liquid cooled integrated circuit assembly which does not rely on pressure to create a thermal contact between a heat sink and an integrated circuit.

Another object of the present invention is to provide an integrated circuit package which transfers a sufficient amount of heat to allow the use of integrated circuits which generate more than 30 watts.

Another object of the present invention is to provide a liquid cooled integrated circuit assembly which transfers a larger number of watts per integrated circuit package than conventional cooling assemblies.

Another object of the present invention is to provide a liquid cooled integrated circuit assembly in which accessibility to individual IC packages is improved.

Another object of the present invention is to provide a liquid cooled integrated circuit assembly which eliminates the use of surfaces which must be made extremely flat at a high cost.

Another object of the present invention is to provide a liquid cooled integrated circuit assembly which utilizes injection molded plastic components as opposed to metal bellows.

These and other objects of the present invention are accomplished by providing an integrated circuit assembly in which the integrated circuit packages function both to house the die and to contain the coolant, so that heat is transferred from the integrated circuit to the coolant by a single transfer element which itself is a part of the integrated circuit package. An integrated circuit package in accordance with the present invention has a thermal resistance which is approximately 3 times better than conventional devices.

A package for an integrated circuit, in accordance with the present invention, comprises a package body having first and second cavities, a wall separating and defining portions of said first and second cavities, a portion of said wall being formed of a thermally conductive material, means for mounting the integrated circuit in said first cavity and for bonding the integrated circuit to said thermally conductive portion of said wall, means for providing coolant to said second cavity so that said coolant is in contact with said thermally conductive portion of said walls, and means for electrically interconnecting the integrated circuit to the environment external to the package.

BRIEF DESCRIPTION OF THE DRAWINGS

FIG. 1 is a schematic view of a conventional bellows and integrated circuit package;

FIG. 2 is a schematic view of a conventional integrated circuit assembly;

FIG. 3 is a schematic side view of liquid cooled integrated circuit assembly according to the present invention;

FIGS. 4 is a sectional view of a first embodiment of an integrated circuit package in accordance with the present invention;

FIG. 5 is an exploded perspective view of the integrated circuit package shown in FIG. 4; and FIG. 6 is a sectional view of a second embodiment of an integrated circuit package in accordance with the present invention.

DESCRIPTION OF THE PREFERRED EMBODIMENTS

A liquid cooled integrated circuit assembly and an integrated circuit package for use in conjunction with the integrated circuit assembly, both in accordance with the present invention, will be described with reference to FIGS. 3-6. FIG. 3 is a schematic side view of a liquid cooled integrated circuit assembly 29 for a plurality of integrated circuit packages $30_{1-3}$. Integrated circuit packages $30_{1-3}$ and coolant supply and removal manifolds $31_{1-2}$ are mounted on a printed circuit board 10, and coolant supply element 88, for example a pump and/or a heat sink for dissipating heat from the coolant, may be remotely located and connected by lines 90. Printed circuit board 10 may be, for example, a conventional multilayer printed circuit board which provides electrical interconnections between the various integrated circuit packages $30_{1-3}$. Each integrated circuit package 30 houses an integrated circuit 32 in a first cavity 33 and has a second cavity 34 which is designed to contain a liquid or gaseous coolant. The coolant is supplied to cavities 34 in respective integrated circuit packages $30_{1-3}$ by flexible tubing 35. Flexible tubing 35 may be used to connect integrated circuit packages 30 in series, as shown. Alternatively, a header (not shown) similar to convention header 26 may be provided, in which case flexible tubing 35 would connect the header to each of the integrated circuit packages 30.

Each integrated circuit package $30_{1-3}$ may be fabricated using conventional technical questions for fabricating integrated circuit packages. For example, integrated circuit package 30 may be a ceramic package formed by firing several layers of socalled green sheets or manufactured from a combination of ceramic and molded plastic elements. An integrated circuit package 30 formed of a ceramic material is shown in FIGS. 4 and 5. integrated circuit package 30 includes a over 36 and a ceramic body portion 38 formed of a ceramic such as alumina ($Al_2O_3$) or silicon carbide. Cover 36 is bonded to ceramic body 38 to isolate cavity 33, and thus integrated circuit 32, from ambient atmospheric conditions. The bond between cover 36 and ceramic body 38 may be, for example, a hermetic seal. Ceramic body 38 comprises a plurality of elements 42, 44, 46 and 48 having the desired metallization provided thereon. The ceramic elements 42, 44, 46 and 48 are stacked in an array and formed into the unitary structure of ceramic body 38 by techniques well known to those of ordinary skill in the art.

Ceramic element 42 has a plurality of contacts 50 on the top surface thereof and leads 52 on the exterior sides of element 42 are electrically connected to contacts 50. An opening 54 in element 42 is an appropriate size to receive cover 36. Element 44 has leads 56 provided on the exterior sides thereof and an opening 58 which is smaller in size than the opening 4 of element 42. Element 44 includes a cover mating portion 60 which is coated with a material suitable for soldering cover 36 to element 44. Element 46 has an internal opening 62 and a plurality of electrical leads 4 on the top surface thereof. The number of leads and contacts illustrated in FIGS. 4 and 5 are limited for ease of illustration; in practice a larger number of leads and contacts may be used.

A metallized area 66 is provided on the top surface of element 48 and is used to bond an integrated circuit 32 to the element 48. The opening 62 in element 46 is of sufficient size to accommodate die 32. Leads 64 are electrically interconnected with integrated circuit 32 by conventional techniques, for example wire bonding or tape-automated bonding (TAB).

Element 68 is provided on the bottom surface of element 48, and opening 70 in element 68 forms second cavity 34. A cover 72 having a coolant inlet $34_1$ and a coolant outlet $34_2$ is provided on the bottom side of element 68 to close cavity 34. Element 48 forms a portion of ceramic body 38 serving as a wall 86 which defines portions of and separates first and second cavities 33, 34. The ceramic material used to form element 48 has a good thermal conductivity (to provide low thermal resistance between integrated circuit 32 and the coolant in cavity 34), is a good electrical insulator, and has a coefficient of thermal expansion matched as closely as possible to the coefficient of thermal expansion of integrated circuit 32.

In integrated circuit package 30 (FIG. 4), the portion of body 38 formed by element 48 is a heat transfer element which transfers heat from integrated circuit 32 to the coolant in cavity 34. There is no requirement of an external heat transfer element. Further, the elimination of bellows or springs from the assembly greatly reduces the stress placed on printed circuit board by mechanical and/or hydraulic pressure performance of the cooling system of the present invention is greatly improved by a large reduction in the thermal resistance of the integrated circuit 32 to liquid coolant heat transfer path. The heat transfer efficiency of integrated circuit package 30 is approximately 3 times better than conventional systems. Experimental results show that the thermal resistance is on the order of 0.2° C./watt measured between points A and B in FIG. 4 where point A is in wall 48 and point B is in the coolant near the outlet 34$_2$. Thus, it is estimated that integrated circuit package 30 will effectively dissipate approximately 90 watts, approximately 3 times the heat transfer capability of a conventional package.

A second embodiment of an integrated circuit assembly in accordance with the present invention is shown in cross-section in FIG. 6. In the second embodiment of an integrated circuit package 30, cavity 34 is formed by walls 76 extending from main body 38. As in the first embodiment, a portion of main body 38 serves as a wall 86 which separates first and second cavities 33, 34. A cover 80 having a coolant inlet 84$_1$ and a coolant outlet 84$_2$ completes cavity 34 and is attached to walls 76. Cover 80 may be, for example, snap-fit or glued to walls 76.

The disclosed embodiments of the present invention are intended to be illustrative and not restrictive, and the scope of the invention is defined by the following claims rather than the foregoing description.

What is claimed is:

1. A package, housing an integrated circuit, comprising:
    a package body having an integrated circuit cavity and a coolant cavity, and a common wall separating and defining portions of aid integrated circuit and coolant cavities, said integrated circuit being provided in said integrated circuit cavity and bonded to said common wall, said coolant cavity housing a coolant which is in direct contact with said common wall;
    means for electrically interconnecting the integrated circuit to the environment external to the package body; and
    means for supplying coolant to said coolant cavity.

2. A package according to claim 1, wherein said shared, common wall comprises a single layer.

3. An integrated circuit package, comprising:
    an integrated circuit;
    a package enclosing said integrated circuit in an environment isolated from ambient conditions and providing electrical interconnections to said integrated circuit, said package including at least one thermally conductive wall having first and second sides, said at least one thermally conductive wall comprising a single layer, said integrated circuit being bonded to said first side of thermally conductive wall; and
    a coolant cavity, said second side of said thermally conductive wall forming a portion of said coolant cavity so that coolant in said coolant cavity is in contact with said second side of said thermally conductive wall.

4. A liquid cooled integrated circuit assembly, comprising:
    a plurality of integrated circuit packages, each said package including, an integrated circuit cavity housing an integrated circuit, electrical interconnections to said integrated circuit, and an integral coolant cavity having an inlet and an outlet and being adapted for a flow of coolant from said inlet to said outlet, said integrated circuit cavity and said integral coolant cavity sharing a common wall having first and second surfaces, each said integrated circuit being bonded to the first surface of a respective common wall;
    means for supporting said packages and providing electrical interconnections between said integrated circuit packages; and
    means for supplying liquid coolant to respective ones of said inlets of said coolant cavities.

5. A liquid cooled integrated circuit assembly, comprising:
    a plurality of integrated circuit packages, each integrated circuit package comprising:
        an integrated circuit, and
        a package body having an integrated circuit cavity and a coolant cavity, and a shared, common wall separating and defining portions of said integrated circuit and coolant cavities, said common wall having a first portion formed of a thermally conductive material, said integrated circuit being provided in said integrated circuit cavity and bonded to said common wall, said coolant cavity housing a coolant which is in direct contact with said common wall;
    a printed circuit board supporting and electrically interconnecting said integrated packages;
    means for providing a liquid coolant; and
    means for supplying coolant from said coolant providing means to said second cavities of said integrated circuit packages.

6. A liquid cooled integrated circuit assembly comprising:
    electrical interconnect means;
    hydraulic interconnect means;
    one or more integrated circuit packages, each package including,
        a cooling chamber hydraulically interconnected with said hydraulic interconnect means, said cooling chamber having at least one thermo-conductive will free of pressure dependant thermal contact members,
        an integrated circuit electrically interconnected with said electrical interconnect means and said integrated circuit directly bonded to said thermo-conductive wall.

* * * * *